US007148951B2

(12) United States Patent
Lallemant et al.

(10) Patent No.: US 7,148,951 B2
(45) Date of Patent: Dec. 12, 2006

(54) LITHOGRAPHIC APPARATUS

(75) Inventors: Nicolas Lallemant, Veldhovn (NL); Marcel Beckers, Eindhoven (NL); Stephan Koelink, Eindhoven (NL); Rob Jansen, Veldhoven (NL); Wladimir Fransiscus Gerardus Maria Hertog, Velden (NL); David Theodorus Willy Van Der Plas, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 225 days.

(21) Appl. No.: 10/972,292

(22) Filed: Oct. 25, 2004

(65) Prior Publication Data

US 2006/0087631 A1    Apr. 27, 2006

(51) Int. Cl.
*G03B 27/42* (2006.01)
*G03B 27/52* (2006.01)
*G03B 27/58* (2006.01)

(52) U.S. Cl. ............................. 355/53; 355/30; 355/72; 359/509

(58) Field of Classification Search .................. 355/30, 355/53, 72, 77; 359/509
See application file for complete search history.

(56) References Cited

U.S. PATENT DOCUMENTS

| | | | |
|---|---|---|---|
| 6,721,031 B1 * | 4/2004 | Hasegawa et al. ............. 355/30 |
| 6,721,032 B1 * | 4/2004 | Hasegawa et al. ............. 355/30 |
| 6,867,844 B1 * | 3/2005 | Vogel et al. ................... 355/30 |
| 6,970,228 B1 * | 11/2005 | Aoki et al. ..................... 355/30 |
| 2002/0191163 A1 * | 12/2002 | Hasegawa et al. ............ 355/30 |

FOREIGN PATENT DOCUMENTS

| EP | 1 229 573 A1 * | 8/2002 |
| EP | 1 447 716 A2 | 8/2004 |
| EP | 1 447 716 A3 | 1/2005 |
| EP | 1 600 818 A1 | 11/2005 |

OTHER PUBLICATIONS

European Search Report issued for European Patent Application No. 05077375.3-2222, dated Mar. 6, 2006.

* cited by examiner

*Primary Examiner*—Alan Mathews
(74) *Attorney, Agent, or Firm*—Pillsbury Winthrop Shaw Pittman LLP (57) ABSTRACT

A lithographic apparatus includes a radiation system for providing a beam of radiation, and a first support for supporting a patterning device. The patterning device serves to pattern the beam of radiation. The apparatus includes a second support for supporting a substrate, a projection system for projecting the patterned beam onto a target portion of the substrate, and an interferometer measurement system for providing an interferometric measurement beam extending along an axis in an elongated volume of gas extending below the projection system. The apparatus also includes a gas conditioning structure for providing a conditioned gas flow in the volume. The gas conditioning structure includes a plurality of gas guiding vanes disposed at an outlet of the structure for guiding the gas flow to the volume. The gas guiding vanes are shaped continuously and are oriented diverging away from the axis of the volume.

14 Claims, 6 Drawing Sheets

LITHOGRAPHIC APPARATUS

FIELD

The present invention relates to a lithographic apparatus. In particular, the invention relates to a lithographic apparatus that includes a gas conditioning structure for providing a conditioned gas flow in a volume extending below a projection system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the ongoing efforts for attaining higher resolutions at smaller imaging dimensions, in lithographic systems, projection systems are used that have numerical apertures that are well above 0.8. These systems tend to be very bulky and wide in dimensions, in particular near the lower surface of the system where the radiation (light) exits the projection system for illuminating a substrate. Furthermore, these high numerical apertures have a working distance that is usually very small (only a few millimeters), which may cause the projection system to be placed very close to the wafer surface. As a result of this, in practical setups, there may be little room provided for arrangements that are operative in the area between the projection system and the substrate. One of these arrangements that are operative in the above indicated area is an air shower system that is present to condition the "air" (which is usually a very fine conditioned composition of gases) in this area. This conditioning, among others, is helps to define a stable gas environment so that interferometric measurement beams may be unhindered by refractive index fluctuations. This helps to obtain reliable (sub) nanometer measurements of the position of the substrate in relation to the projection system, so that a pattern may be reliably imaged at a predefined position of the substrate.

These bulkier projection systems and closer working distances may make it difficult to position the air shower system in such a way that this area as a whole is sufficiently reached. In particular, there may not be enough room to place an air shower system in such a way that the gas flow is sufficiently able to condition the volume in which the substrate holder is moved below the projection system. In this volume, the interferometric measurement beams extend to measure the position of the substrate. Generally, this volume may be bounded by the projection system, for example, the exit plane of the lower lens in the projection system. This volume may also extend below a mirror block that is used in determining the z-height of the substrate to be illuminated (Z-mirror).

Current setups for air shower systems generally have two major directions of flow: at a distance from the lens, the gas flows perpendicular to the longitudinal axis of an elongated volume defined by the path of the interferometric measurement beams, and closer to the lens center, the gas flows substantially at a small angle relative to the longitudinal axis. However, in the transitional region extending between these major flow directions, the flow is generally undetermined. This transitional region typically has a wide extension in the elongated volume it is attempting to condition so that in practice, large portions of the elongated volume may suffer from sub-optimal conditioning conditions.

SUMMARY

It is an aspect of the present invention to provide a lithographic system where the area below the projection system is better reached by the air shower system.

In one embodiment of the present invention, there is provided a lithographic apparatus that includes a radiation system for providing a beam of radiation, and a first support for supporting a patterning device. The patterning device serves to pattern the beam of radiation. The apparatus also includes a second support for supporting a substrate, a projection system for projecting the patterned beam onto a target portion of the substrate, an interferometer measurement system for providing an interferometric measurement beam extending along a central axis in an elongated volume of gas extending below the projection system, and a gas conditioning structure for providing a conditioned gas flow in the elongated volume. The gas conditioning structure includes a plurality of gas guiding vanes disposed at an outlet of the structure for guiding the gas flow to the elongated volume. The gas guiding vanes are shaped continuously and are oriented diverging away from the central axis of the elongated volume.

In an embodiment of the invention, there is provided a lithographic apparatus that includes a gas conditioning structure for providing a conditioned gas flow in an elongated volume defined by an interferometric measurement beam path in a lithographic apparatus. The gas conditioning structure includes a plurality of gas guiding vanes disposed at an outlet of the structure for guiding the gas flow to the elongated volume. The gas guiding vanes are shaped continuously and are oriented diverging away from a central axis of the elongated volume for providing a substantially radial gas flow pattern towards the elongated volume.

In an embodiment of the invention, there is provided a gas conditioner that provides a conditioned gas flow in an elongated volume defined by an interferometric measurement beam path. The gas conditioner includes a plurality of gas guiding vanes disposed at an outlet of the gas conditioner for guiding the gas flow to the elongated volume. The gas guiding vanes are smoothly contoured and diverge away from a central axis of the elongated volume for providing a substantially radial gas flow pattern towards the elongated volume.

According to the invention, in a lithographic apparatus, a gas conditioning structure for providing a conditioned gas flow in a volume includes a plurality of oriented gas guiding vanes being provided in a front outlet of the structure for guiding the gas flow to the volume. The gas guiding vanes are continuously diverging away from the volume.

By such an arrangement, the transitional region between the flow direction perpendicular to the longitudinal axis, and the flow regime parallel to the longitudinal axis may be better conditioned due to a better definition of gas flow. The bent gas vanes introduce no sharp angles that may cause undesired discontinuities in the air flow pattern. In this way, adverse conditioning circumstances such as flow instabilities may be reduced, or even prevented.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
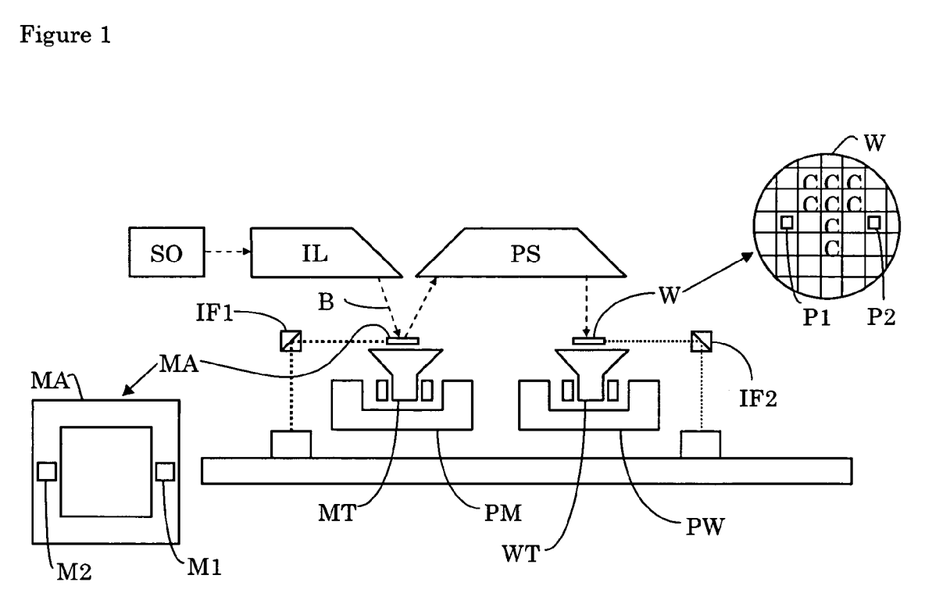
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example, with respect to the projection system PS. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system". In particular, the projection system may include a plurality of partly stacked optical elements which may be transmissive (lenses), or reflective (mirrors). Generally, the projection system is configured in such a way the radiation exits from the projection system through a lowest optical element, defining a lower surface of the projection system. More in particular, the lower surface of the projection system is defined by the lowest surface that is present above the scan region of the substrate. In a number of configurations, this lowest surface may be formed by a Z-mirror, that is used for controlling the Z-position of the support structure that supports the substrate.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam so that the radiation beam may have a desired uniformity and intensity distribution in its cross-section.

The radiation beam B is incident on the patterning device (e.g., mask MA), which is held on the support structure (e.g., mask table MT), and is patterned by the patterning device MA. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
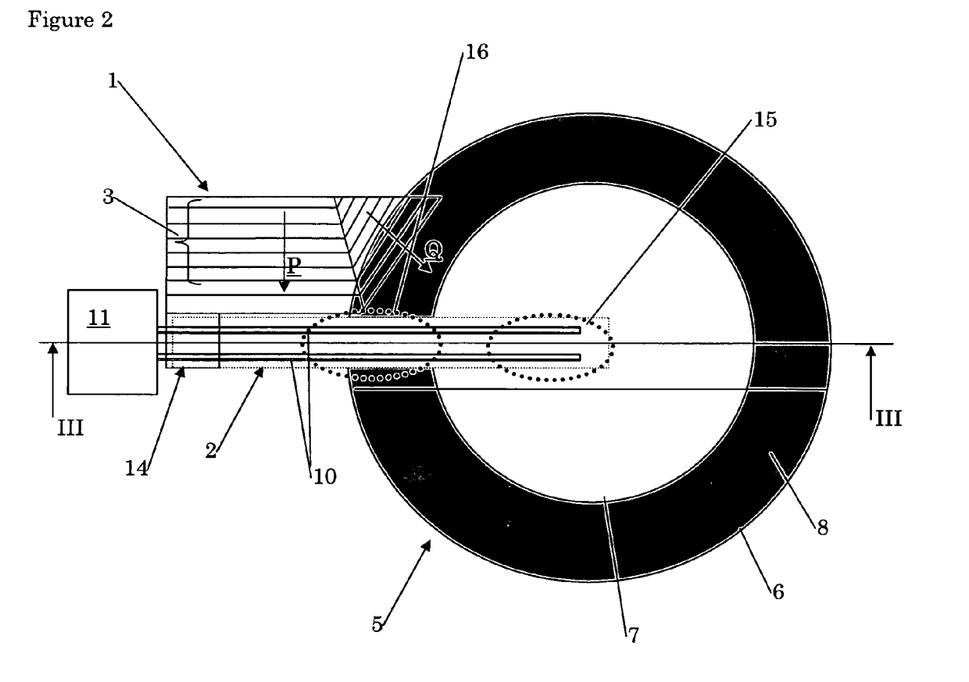
FIG. 2 depicts a plan view of a conventional embodiment showing the projection system when viewed from below.
Figure 3:
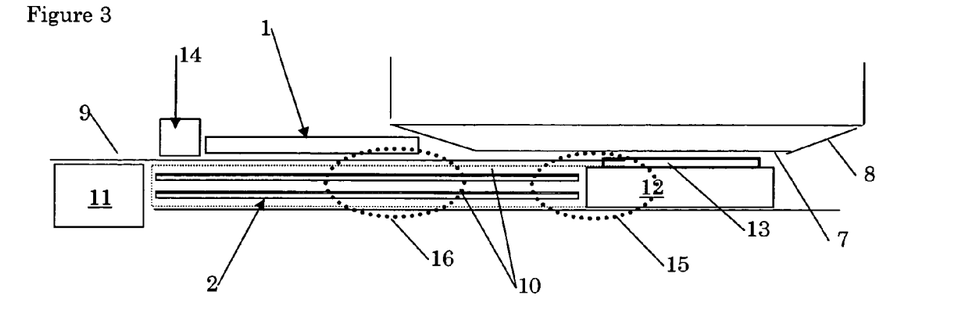
FIG. 3 depicts a side sectional view of the conventional embodiment showing the projections system viewed according to line III—III in FIG. 2.

FIG. 2 shows in plan view from below a conventional arrangement of a gas conditioning structure 1, which may also be referred to as a gas conditioner, for conditioning gas in volume 2. FIG. 3 shows a side view of the arrangement illustrated in FIG. 2. In the remainder, this gas conditioning structure 1 may also be indicated as "air shower," although the skilled person understands that the air this structure emits may by formed by other gasses than ambient air. The air shower 1 includes a plurality of alongside oriented gas guiding vanes 3 that are provided in a front outlet 4 of the structure for guiding the gas flow to the volume 2. The projection system 5 is shown as a generally round hull 6 that encloses a plurality of stacked lenses (not shown). Attached to the hull 6, or near it, subsidiary systems may be present (not illustrated) to condition (parts) of the optical elements provided in the optical system and the environment close to the (exit) optical elements. The hull 6 is bounded by a lower surface 7. The grayed annular part 8 is partly inclined relative to the lower surface 7, and may offer some room for accommodating a part of the air shower 1, as is apparent from FIG. 3. In FIG. 3, Z-mirror 9 is indicated which is a mirror block that is used in determining the z-height of the substrate 13 to be illuminated (Z-mirror). This mirror block 9 may actually form a surface even lower than the lower surface 7 of the projection system 5.

Parallel to the Z-mirror 9 and below it, interferometric measurement beams 10 are radiated from an interferometric measuring unit 11 for determining X- and/or Y-positions of the stage 12 that supports the substrate 13 (see FIG. 3). A separate air shower 14 may be present to provide a vertical transverse flow in the region adjacent to the measuring unit 11.

Generally speaking, the volume 2 to be conditioned is formed along and enclosing the path of the interferometric beams 10, for reasons of controlling the refractive index of the gas. Thus, it can be seen that the volume central to the projection system 5 (indicated by dotted lines 15), due to its low position, may be difficult to condition, because it is located farthest away from the air shower 1. To be able to obtain the central parts 15 below the projection system 5, the air shower 1 has a generally two part main direction of gas output: a first generally transverse direction P relative to the path of beams 10 in the volume 2 and closer to the lens center, the gas is flowing in a direction Q substantially at a small angle (around 45°) relative to the beam path. It can be seen that through the discontinuous transition from these two gas flow regions that the region indicated by 16 may suffer from disturbances in the gas flow, which may result in unstable flow conditions. Thus, the refractive index in the region 16 may be difficult to control in the conventional setup of the air shower 1, thereby resulting in accuracy loss as to the true position of the substrate 13 relative to the projection system 5. This may result in imaging defects that may affect the performance of the devices manufactured by the lithographic process.

Figure 4:
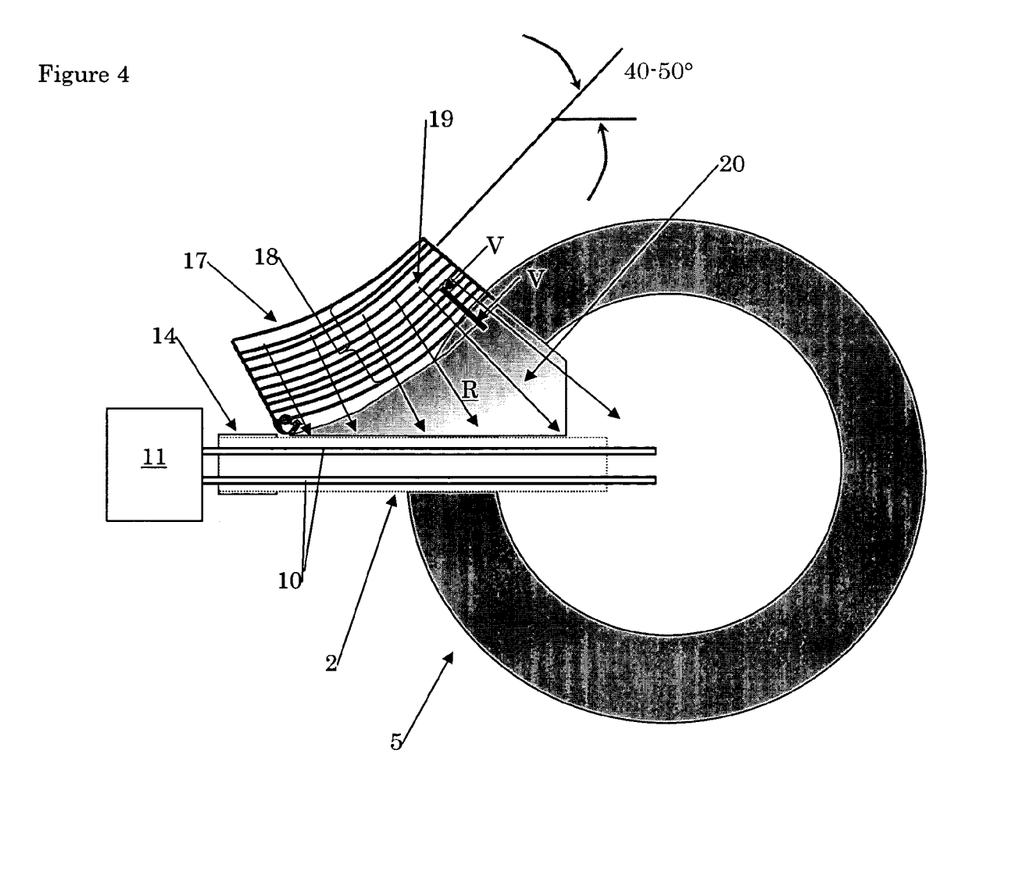
FIG. 4 depicts a plan view of an embodiment according to the invention showing the projection system when viewed from below.

FIG. 4 shows a plan view of an embodiment according to the invention showing the projection system 5 when viewed from below. In FIG. 4, the gas conditioning structure 17 includes a plurality of oriented gas guiding vanes 18. In contrast to the embodiment depicted in FIG. 3, the oriented vanes 18 are manufactured from a single piece vane that is curved. Thus, the flow regions P and Q identified in FIG. 2 do not have a sharp transition zone as indicated by 16 in FIG. 2. In contrast, the gas guiding vanes 18 are shaped in a continuous manner and oriented diverging away from the central axis formed by the path of the interferometric beams 10, thereby providing a more radial flow, as illustrated by arrows R. In particular, in contrast to the angular geometry of FIG. 2, in this embodiment, the outlet 19 is formed according to a segment of an annular shape. In this form, as seen along the radial lines R, a substantial equal amount of gas flow is outputted to all directions, in contrast to the FIG. 2, where in the direction to region 15, only a limited amount of gas flow may be possible due to the angled geometry of the air shower 1, thereby causing sub-optimal conditioning of the environment 15. The longitudinal axis of the gas conditioning structure 17 may be rotated with respect to the embodiment depicted in FIG. 2, in particular, the initial angle of divergence between the vanes 18 and the axis may be in the range of about 25–40°. The initial angle of divergence may be in the range of 30–38°. Such an initial divergence may largely diminish the transitional zone 16, because due to this, the transverse extension of the airflow may be limited to about 7–15°, which may be optimal to keep flow conditions stable across the whole transverse (with respect to the radial flow R) extension range. To optimally reach the central region 15, the final angle of divergence between the vanes 18 and the axis lies in the range of 40–50°. Further, in FIG. 4, because the initial angle of divergence may be substantial, a "gap" is present between the gas conditioning structure 17 and the volume 2. To provide optimal flow conditions and to guide the flow towards the gas conditioning structure, it has been found to be favorable to introduce a guiding element 20 that guides the flow from the outlet 19 towards the volume 2. Through this guiding element 20, the flow "sticks" towards the guiding surface of the element 20 and may be guided optimally to the volume 2, thereby substantially preserving stable flow conditions of radial flow R.

Figure 5:
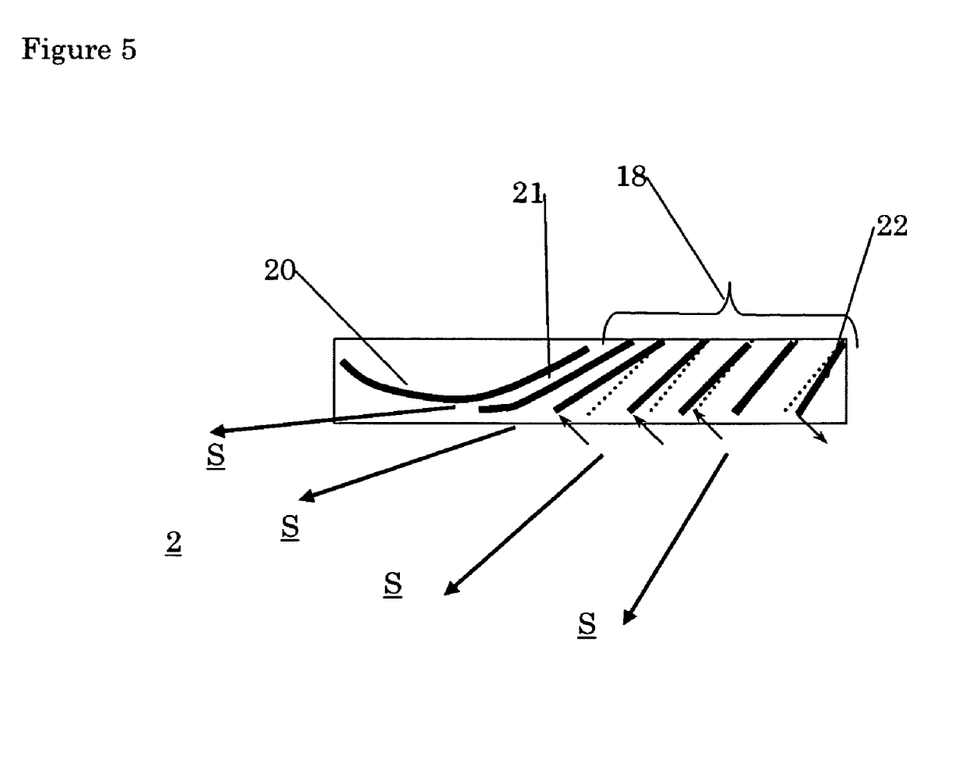
FIG. 5 depicts a cross sectional view of along line V—V in FIG. 4.

FIG. 5 further illustrates an embodiment in which the gas guiding vanes 18 are oriented at an angle relative to each other to provide a second radial gas flow pattern extending downwards relative to the lower surface. Thus, the vanes 18 are oriented alongside each other in the longitudinal direction, however, in the direction normal to the vanes, the vanes 18 are oriented at an angle. In this way, a second radial flow S is provided generally transverse to the previously illustrated radial flow R, in which the vanes 18 closest to the guiding element 20 axis are oriented to provide a gas flow in an upper part, and vanes distanced from the guiding element 20 are oriented to provide a gas flow in a lower part of the volume 2. To provide stable flow conditions, the relative angle may range between about 5° and about 15°, and is preferably about 7°±0.5°.

Figure 6:
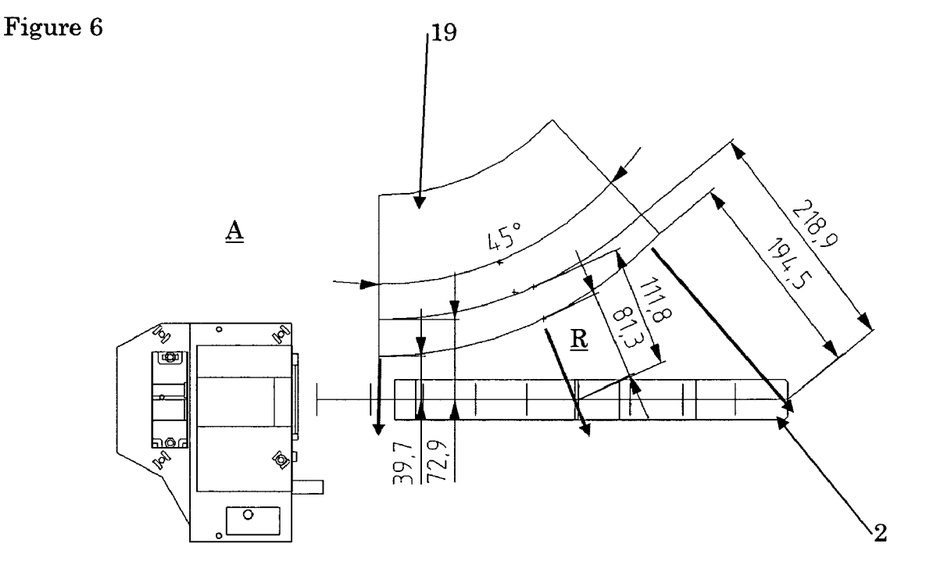
FIG. 6 depicts a specific layout of an embodiment of a gas conditioning structure relative to a volume to be conditioned.
Figure 7:
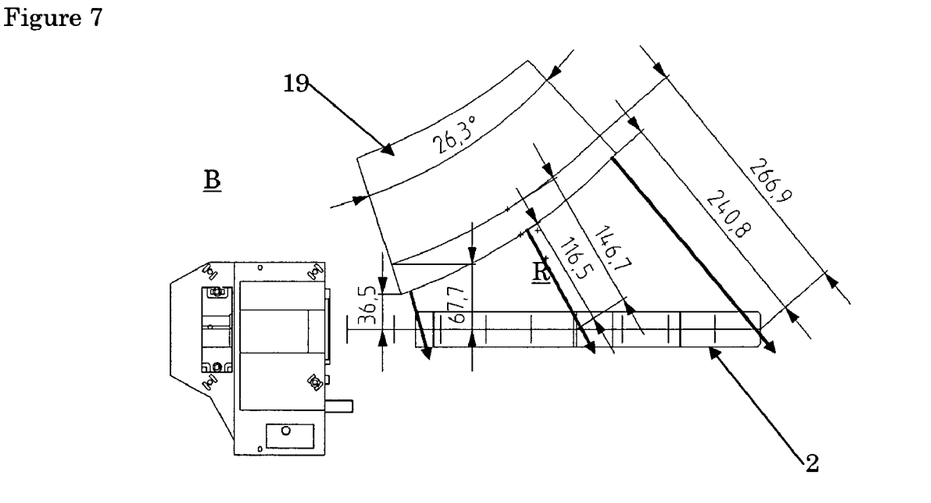
FIG. 7 depicts a specific layout of an embodiment of a gas conditioning structure relative to a volume to be conditioned.
Figure 8:
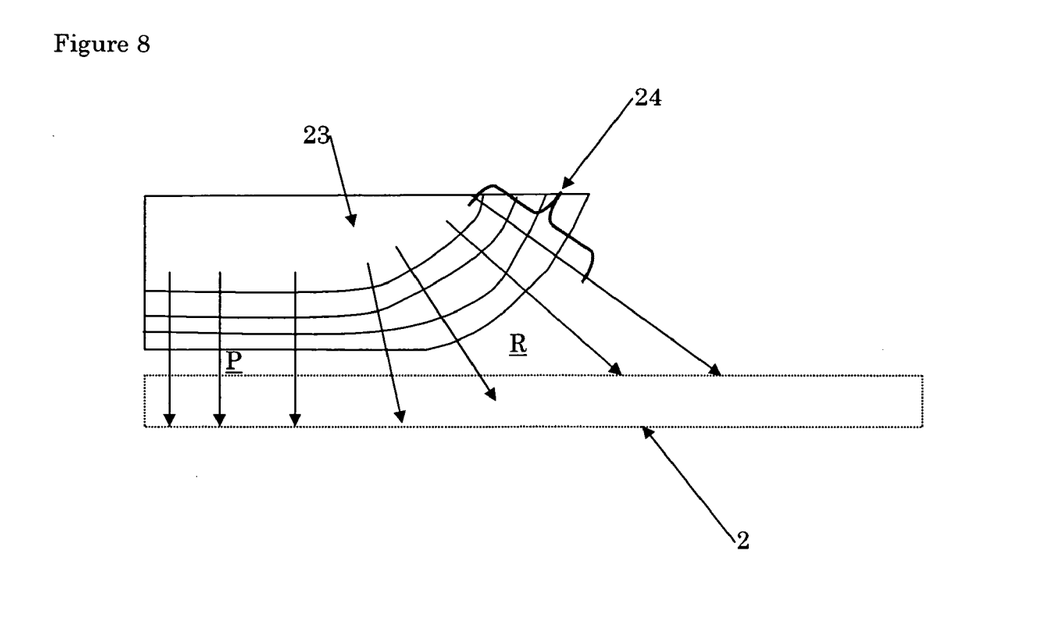
FIG. 8 depicts a specific layout of an embodiment of a gas conditioning structure relative to a volume to be conditioned.

FIG. 6–FIG. 8 further show some examples of inventive gas conditioning unit designs, which are characterized by curved vanes 18 for providing radial oriented flow over substantially the whole flow region R. Such radial flow is designed to appear to be coming from a localized central zone, in contrast to the flow conditions used conventionally, which typically use parallel non divergent flow to keep flow conditions stable. In the example illustrated in FIG. 6, the outlet 19 is annular in shape and extends over an angle of about 45° and starts generally parallel to the volume 2. In the example illustrated in FIG. 7, the outlet 19 is annular and relatively rotated with respect to the volume. The curvature extends over a range of about 26°. In the examples of FIG. 6 and FIG. 7, a radial flow R is provided in which, in the direction along the vanes 18 (in tangential direction), a ratio of outletted volume of air per angular unit is substantially constant, thereby providing the whole angular range with substantially similar flow conditions. To this end, the outlet may be formed to provide in a direction along the vanes a ratio of gas volume per distance that is substantially constant. This is preferably provided by keeping the distance between front vane 21 and rear vane 22 (see FIG. 5) substantially constant over the entire extension of the vanes.

FIG. 8 shows an embodiment that may be viewed as a combination of the prior art embodiment illustrated in FIG. 2 and the inventive embodiment illustrated in FIG. 4. In this respect, a gas conditioning structure 23 is shown that has continuous shaped vanes 24 that may be made from a single piece. The vanes are oriented partly parallel to the axis of the elongated volume 2, and partly curve away from the volume in order to provide a radial flow R that continuously aligns the generally transverse flow direction P.

Figure 9:
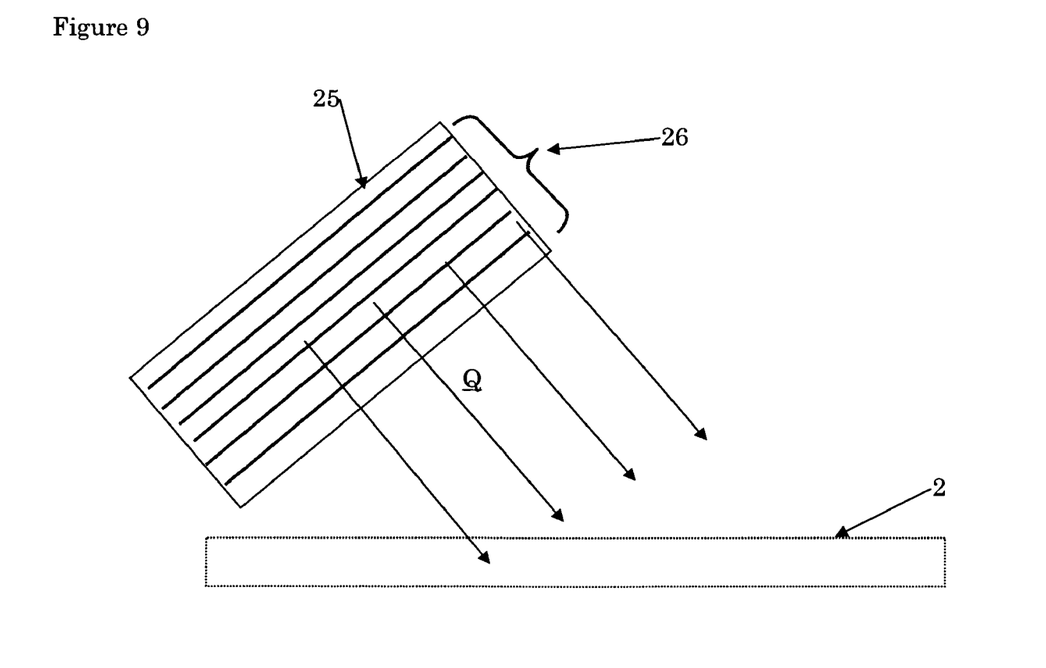
FIG. 9 depicts a specific layout of an embodiment of a gas conditioning structure relative to a volume to be conditioned.

FIG. 9 shows an alternative embodiment according to the invention in which another gas conditioning structure 25 is illustrated. The gas conditioning structure 25 includes gas guiding vanes 26 that are shaped continuously and are oriented diverging away a longitudinal axis of an elongated volume 2. In this embodiment, the flow that is generated is generally unidirectional in a direction Q substantially at a small angle (around 45°) relative to the beam path. In this embodiment, the vanes may be shaped so that no sharp transitions occur in the flow regime of flow directed towards the elongated volume 2.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a radiation system for providing a beam of radiation;
   a first support for supporting a patterning device, the patterning device serving to pattern the beam of radiation;
   a second support for supporting a substrate; and
   a projection system for projecting the patterned beam onto a target portion of the substrate;
   an interferometer measurement system for providing an interferometric measurement beam extending along a central axis in an elongated volume of gas extending below the projection system; and
   a gas conditioning structure for providing a conditioned gas flow in said elongated volume, said gas conditioning structure comprising a plurality of gas guiding vanes disposed at an outlet of said structure for guiding said gas flow to said elongated volume, wherein said gas guiding vanes are shaped continuously and are oriented diverging away from said central axis of said elongated volume.

2. A lithographic apparatus according to claim 1, wherein said gas guiding vanes are curved for providing a substantially radial gas flow pattern towards said elongated volume.

3. A lithographic apparatus according to claim 2, wherein said gas guiding vanes extend in a straight direction.

4. A lithographic apparatus according to claim 1, wherein said gas guiding vanes extend over the breadth of the outlet in a single piece.

5. A lithographic apparatus according to claim 1, wherein said outlet is formed according to a segment of an annular shape, and wherein said conditioned gas exits radially from said outlet.

6. A lithographic apparatus according to claim 1, wherein an initial angle of divergence between said vanes and said central axis lies in the range of about 25° to about 40°.

7. A lithographic apparatus according to claim 1, wherein a final angle of divergence between said vanes and said central axis lies in the range of about 40° to about 50°.

8. A lithographic apparatus according to claim 1, wherein a flow guiding body is arranged adjacent to said outlet for providing flow guidance to said elongated volume.

9. A lithographic apparatus according to claim 1, wherein said gas guiding vanes are oriented at an angle relative to each other to provide a second gas flow extending downwards relative to a lower surface of the projection system.

10. A lithographic apparatus according to claim 9, wherein a vane closest to the central axis is oriented to provide a gas flow in an upper part of said volume, and a vane distanced from the central axis is oriented to provide a gas flow in a lower part of said elongated volume.

11. A lithographic apparatus according to claim 9, wherein said relative angle ranges between 5 and 10°.

12. A lithographic apparatus according to claim 1, wherein said outlet is formed to provide in a direction along said vanes a ratio of gas volume per distance that is substantially constant.

13. A lithographic apparatus comprising a gas conditioning structure for providing a conditioned gas flow in an elongated volume defined by an interferometric measurement beam path, said gas conditioning structure comprising a plurality of gas guiding vanes disposed at an outlet of said structure for guiding said gas flow to said elongated volume, wherein said gas guiding vanes are shaped continuously and are oriented diverging away from a central axis of said elongated volume for providing a substantially radial gas flow pattern towards said elongated volume.

14. A gas conditioner that provides a conditioned gas flow in an elongated volume defined by an interferometric measurement beam path in a lithographic apparatus, said gas conditioner comprising a plurality of gas guiding vanes disposed at an outlet of said gas conditioner for guiding said gas flow to said elongated volume, wherein said gas guiding vanes are smoothly contoured and diverge away from a central axis of said elongated volume for providing a substantially radial gas flow pattern towards said elongated volume.

* * * * *